(12) United States Patent
Conley et al.

(10) Patent No.: US 6,349,056 B1
(45) Date of Patent: Feb. 19, 2002

(54) METHOD AND STRUCTURE FOR EFFICIENT DATA VERIFICATION OPERATION FOR NON-VOLATILE MEMORIES

(75) Inventors: Kevin M. Conley, San Jose; Daniel C. Guterman, Fremont; Carlos J. Gonzalez, Los Gatos, all of CA (US)

(73) Assignee: Sandisk Corporation, Sunnyvale, CA (US)

( * ) Notice: Subject to any disclaimer, the term of this patent is extended or adjusted under 35 U.S.C. 154(b) by 0 days.

(21) Appl. No.: 09/751,178

(22) Filed: Dec. 28, 2000

(51) Int. Cl.[7] ............................................. G11C 16/04
(52) U.S. Cl. ............................ 365/185.04; 365/185.33
(58) Field of Search ........................ 365/185.04, 185.09, 365/185.22, 185.33

(56) References Cited

U.S. PATENT DOCUMENTS 5,410,544 A * 4/1995 Kreifels et al. ......... 365/185.33
5,748,939 A * 5/1998 Rozman et al. ......... 365/185.33
5,890,152 A * 3/1999 Rapaport et al. .............. 707/6
6,266,273 B1 * 7/2001 Conley et al. ......... 365/185.04

* cited by examiner

Primary Examiner—Trong Phan
(74) Attorney, Agent, or Firm—Flehr Hohbach Test Albritton & Herbert LLP

(57) ABSTRACT

An improved flash EEPROM memory-based storage subsystem includes one or more flash memory arrays, each with three data registers and a controller circuit. During a flash program operation, one data register is used to control the program operation, a second register is used to hold the target data value, and a third register is used to load the next sector's data. Subsequent to a flash program operation, a sector's data are read from a flash array into the first data register and compared to the target data stored in the second register. When the data is verified good, the data from the third register is copied into the first and second registers for the next program operation. This creates an improved performance system that doesn't suffer data transfer latency during program operations that require data verification after the program operation is complete.

9 Claims, 4 Drawing Sheets

METHOD AND STRUCTURE FOR EFFICIENT DATA VERIFICATION OPERATION FOR NON-VOLATILE MEMORIES

TECHNICAL FIELD

This invention pertains to the field of semiconductor non-volatile memory architectures and their methods of operation, and has application to flash electrically erasable and programmable read-only memories (EEPROMs).

BACKGROUND

A common application of flash EEPROM devices is as a mass data storage subsystem for electronic devices. Such subsystems are commonly implemented as either removable memory cards that can be inserted into multiple host systems or as non-removable embedded storage within the host system. In both implementations, the subsystem includes one or more flash devices and often a subsystem controller.

Flash EEPROM devices are composed of one or more arrays of transistor cells, each cell capable of non-volatile storage of one or more bits of data. Thus flash memory does not require power to retain the data programmed therein. Once programmed however, a cell must be erased before it can be reprogrammed with a new data value. These arrays of cells are partitioned into groups to provide for efficient implementation of read, program and erase functions. A typical flash memory architecture for mass storage arranges large groups of cells into erasable blocks. Each block is further partitioned into one or more addressable sectors that are the basic unit for read and program functions.

The subsystem controller performs a number of functions including the translation of the subsystem's logical block address (LBA) to a physical chip, block, and sector address. The controller also manages the low level flash circuit operation through a series of commands that it issues to the flash memory devices via an interface bus. Another function the controller performs is to maintain the integrity of data stored to the subsystem through various means (e.g. by using an error correction code, or ECC).

FIG. 1 shows a typical prior art flash EEPROM device's internal architecture 4000. The key features include an I/O bus 411 and control signals 412 to interface to an external controller, a memory control circuit 450 to control internal memory operations with registers for command, address and status, one or more arrays 400 of flash EEPROM cells, each array with its own row decoder (XDEC) 401 and column decoder (YDEC) 402, a group of sense amplifiers and program control circuitry (SA/PROG) 454 and a Data Register 404.

If desired, a plurality of arrays 400, together with related X decoders, Y decoders, program/verified circuitry, data registers, and the like is provided, for example as taught by U.S. Pat. No. 5,890,192; issued Mar. 30, 1999, and assigned to Sandisk Corporation, the assignee of this application, and which is hereby incorporated by reference.

The external interface I/O bus 411 and control signals 412 could be configured with the following signals:

CS—Chip Select. Used to activate flash memory interface.

RS—Read Strobe. Used to indicate AD bus is being used for a data read operation.

WS—Write Strobe. Used to indicate AD bus is being used for a data write operation.

AS—Address Strobe. Indicates that AD bus is being used to transfer address information.

AD[7:0]—Address/Data Bus Used to transfer data between controller and flash memory command, address and data registers.

This interface is given only as an example as other signal configurations can be used to give the same functionality. This diagram shows only one flash memory array 400 with its related components, but a multiplicity of arrays can exist on a single flash memory chip that share a common interface and memory control circuitry but have separate XDEC, YDEC, SA/PROG and DATA REG circuitry in order to allow parallel read and program operations.

Data from the EEPROM system 4000 data register 404 to an external controller via the data registers coupling to the I/O bus AD[7:0] 411. The data register 404 is also coupled the sense amplifier/programming circuit 454. The number of elements of the data register coupled to each sense amplifier/ programming circuit element may depend on the number of bits stored in each flash EEPROM cell. Each flash EEPROM cell may include a plurality of bits, such as 2 or 4, if multi-state memory cells are employed.

Row decoder 401 decodes row addresses for array 400 in order to select the physical sector being accessed. Row decoder 401 receives row addresses via internal row address lines 419 from memory control logic 450. Column decoder 402 receives column addresses via internal column address lines 429 from memory control logic 450.

FIG. 2 shows a typical flash card architecture that has a single controller 301 that performs host and memory control functions and a flash memory array that is composed of one or more flash memory devices. The system controller and the flash memory are connected by bus 302 that allows controller 301 to load command, address, and transfer data to and from the flash memory array.

It is common practice that each sector's worth of host data programmed into a sector is appended with an Error Detection and Correction Code (ECC) that is used to determine the validity of the stored data. Some such systems would use the occasion of the transfer as an opportunity to check the validity of the data being read as a way to ensure that the data has not been corrupted.

In order to ensure the validity of the data programmed, some systems read the data from a sector immediately after it is programmed. The data is verified before the next operation proceeds by means of ECC, data comparison, or other mechanism. In prior art systems, this data verification, as it is known to those experienced in the art, occurs during the data transfer that takes place after the read. Thus there is an increase in the time to perform a program operation due to the addition of a read operation and the transfer of the data from the flash memory device to the controller circuit. Due to the overall fidelity of these storage devices, the occurrence of failure during such verifications is rare.

FIG. 3 shows a timing diagram of a sector program/verify operation in which data is programmed to a destination address (DST[N]) and subsequently read in order to verify before programming to the next destination address (DST [N+1]). The READ signal indicates that a read is taking place from the source sector. The XFER signal indicates a data transfer between the flash data register and the controller. The R/WB signal indicates the direction of the transfer (high being a read from the flash to the controller and low being write from the controller to the flash). The PROG signal indicates that a program operation is taking place upon the destination page.

FIG. 4 illustrates the sequence of events that occur during a program/verify operation:

1. Transfer data to master data register 403 from external controller circuit (not shown).

2. Transfer contents of master data register 403 to slave data register 404.
3. Program the data from slave data register 404 into flash memory array 400.
4. Read back data from flash memory array 400 into slave data register 404.
5. Transfer data from slave register 404 to master data register 403.
6. Transfer data from master data register 403 to external controller circuit (not shown) for validation.

The exact cost of these verification operations varies depending on the times of various flash memory operations, the data set size, the I/O bus size and the I/O bus cycle time. But an example using some typical values is shown below:

$$T_{RD}=25 \text{ us } T_X=26.4 \text{ us } T_{PRG}=300 \text{ us}$$

The total time to program and verify a single sector (as shown in FIG. 4).

$$T_{Pgm/Vfy}=T_X+T_{PRG}+T_{RD}+T_X=377 \text{ us}$$

Making the data verification time 14% of the overall program/verify operation.

It is a general trend in non-volatile memory design to increase the number of cells that can be programmed and read at one time in order to improve the write and read performance of these devices. This can be accomplished by increasing the number of memory cell arrays on a single die, increasing the page size within a single plane, programming multiple chips in parallel or some combination of these three techniques. The result of any of these is that the data transfer length increases for the larger number of cells being programmed or read with the program and read times changing little or not at all. Thus, the expense of data verification in a system that has such increased parallelism is that much higher. As an example, the same timing values as used in the above example show the impact on a system with a four-fold increase in parallelism:

$$T_{Pgm/Vfy}=4*T_X+T_{PRG}+T_{RD}+4*T_X=526.4 \text{ us}$$

Making the data verification time 24% of the overall four-page copy operation.

SUMMARY

A flash memory device is taught which is capable of performing a post-programming verification operation without transferring the data to an external controller circuit and which allows data transfer from the external controller during those program or verify operations.

A non-volatile memory system is designed with circuitry that includes three data registers. The first data register controls programming circuitry and stores data from read operations. The second data register holds a copy of the programming data for later verification. The third data register is used to transfer data during program, verify and read operations. Prior to a program operation, data is transferred into the first and second registers. Subsequent to the programming operation, the data are read back from the cells just programmed and are stored in the first register. The contents of that register are then compared with the contents of the second register. A match between the two sets of data indicates that the data was programmed correctly and status indicating a successful verification is produced. This comparison may be repeated to verify the data under different read voltage conditions to ensure proper amounts of read margin exist. During the program and verify operations, the third data register is used to transfer the next set of data to be programmed.

DETAILED DESCRIPTION

The present invention comprises both a system for and a method of performing program/verify operations on a flash memory device that do not require data to be transferred from the memory device in order to allow an external controller to simultaneously transfer data to the device for subsequent programming operations.

Figure 1:
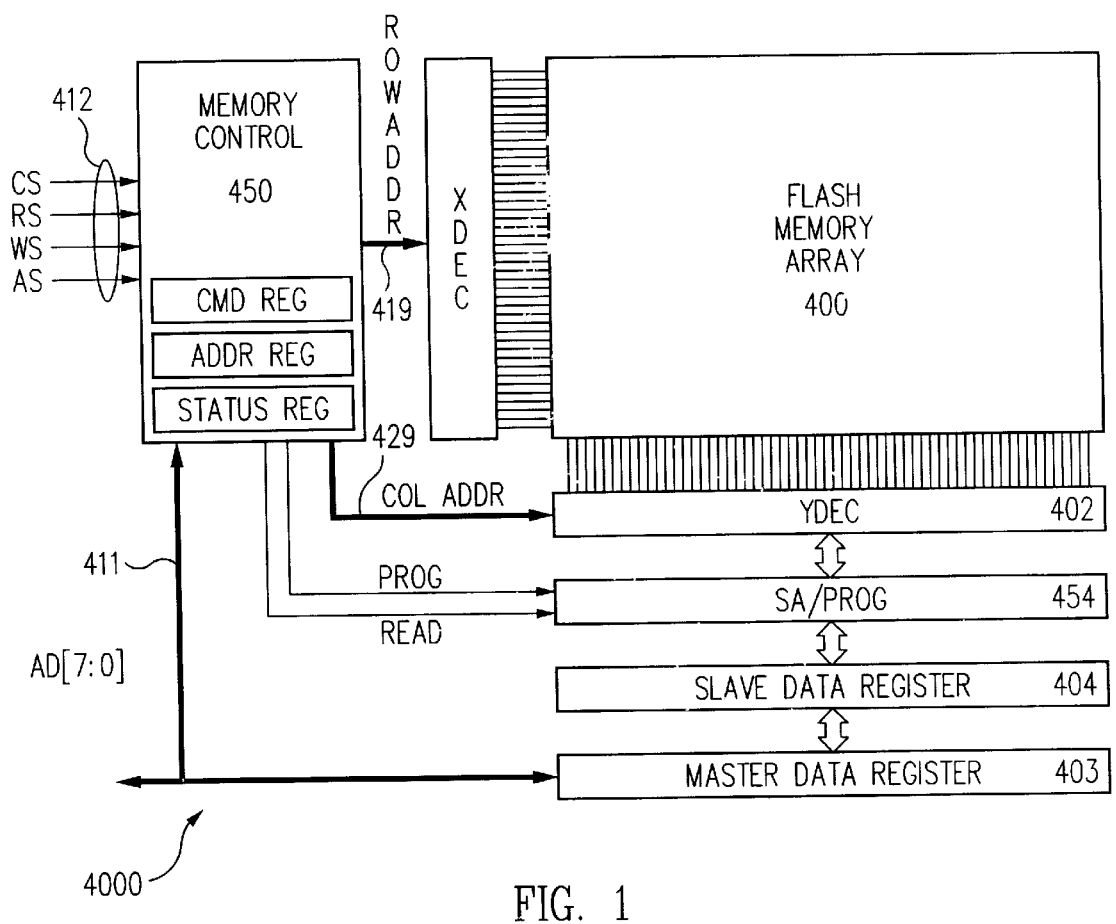
FIG. 1 shows a block diagram of a typical prior art EEPROM.
Figure 2:
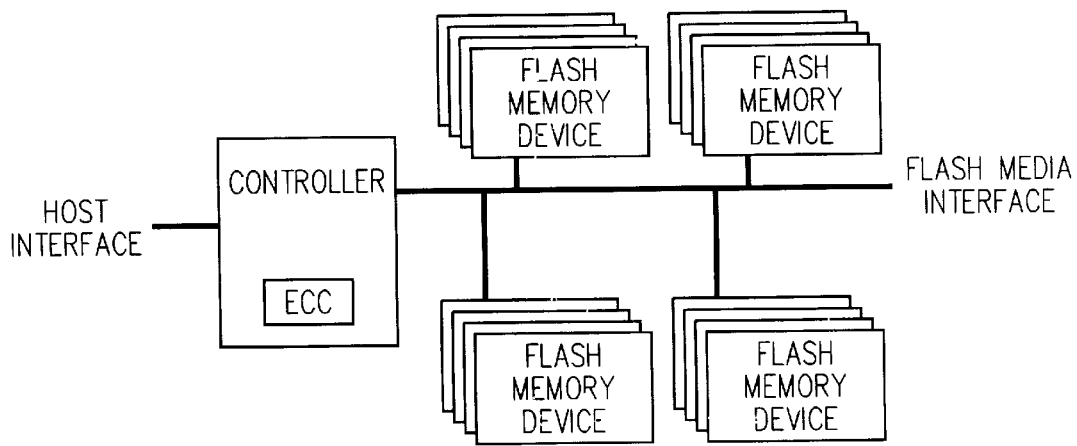
FIG. 2 shows a typical flash-based storage subsystem architecture of the prior art.
Figure 3:
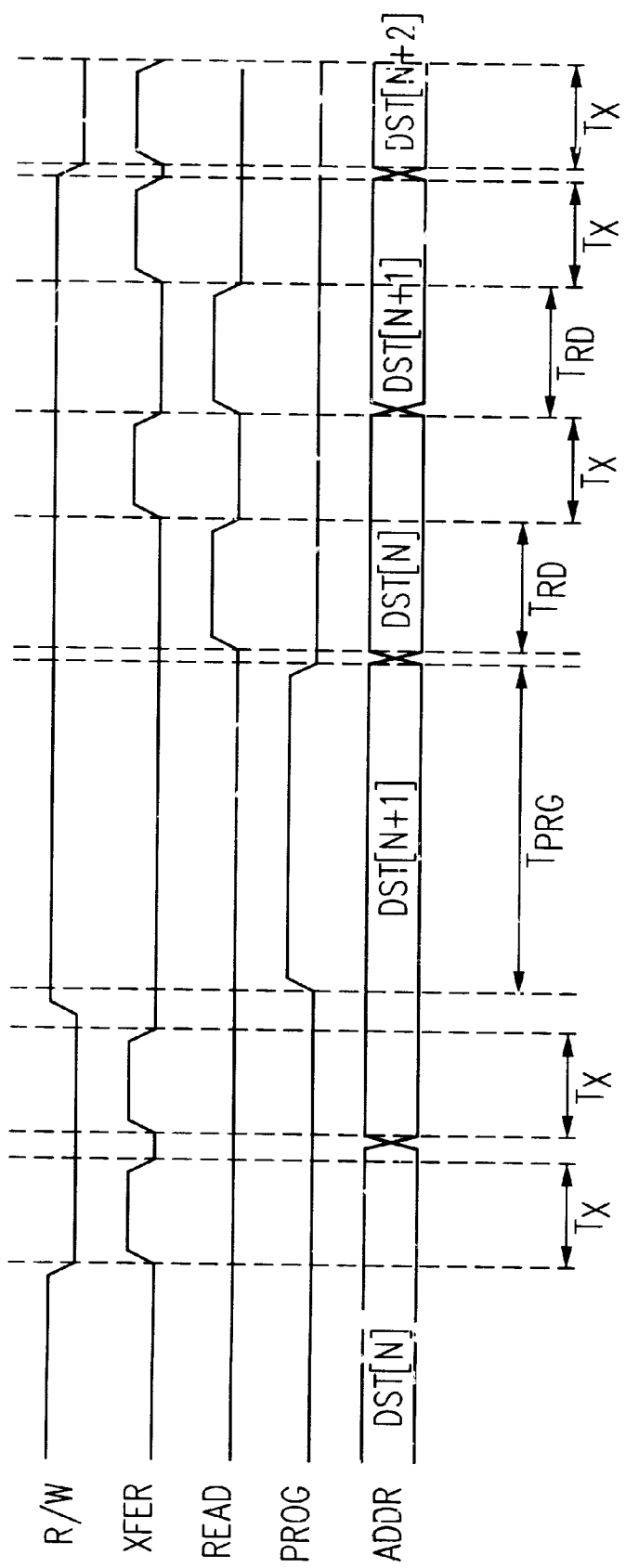
FIG. 3 shows a timing diagram of a two-sector program/verify operation of the prior art.
Figure 5:
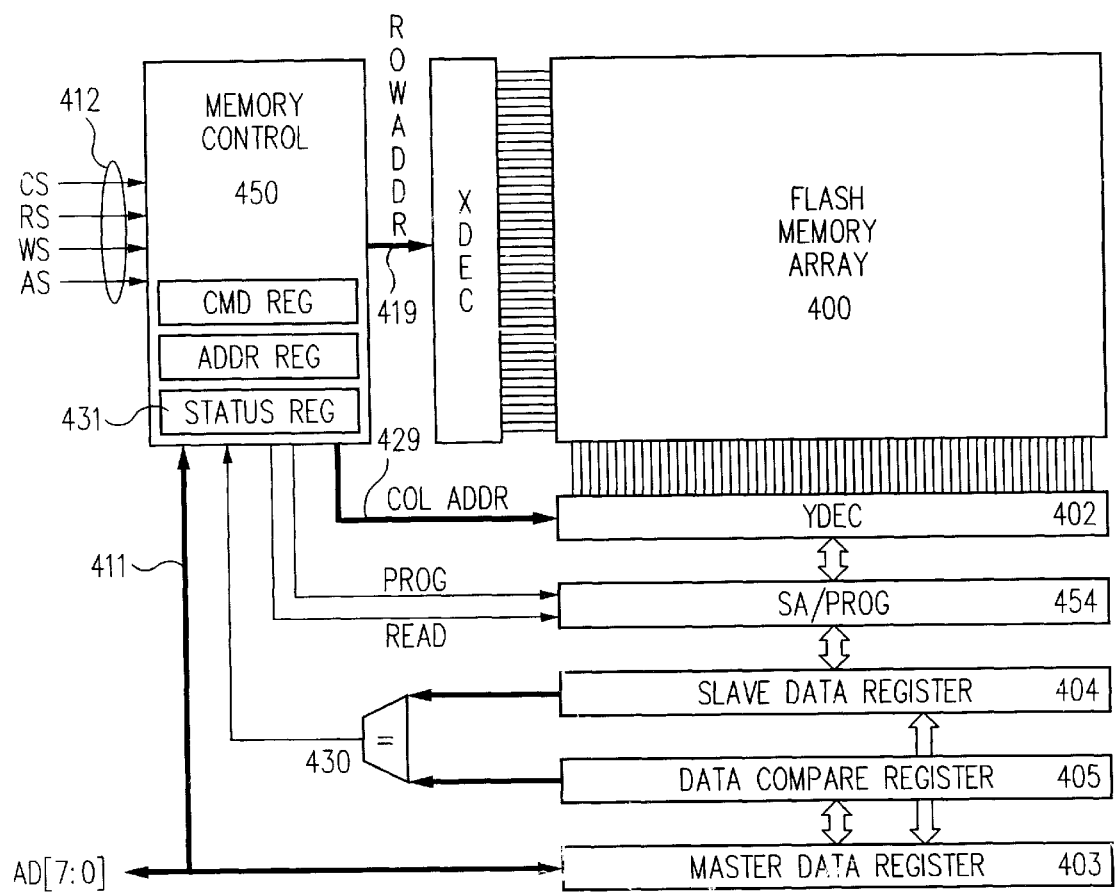
FIG. 5 shows a schematic representation of a semiconductor non-volatile memory according to one embodiment of the present invention.

FIG. 5 shows a diagram representing a semiconductor non-volatile memory that is constructed in accordance with one embodiment of this invention. The descriptions of each component in this diagram are similar to that previously described with respect to FIG. 1, with the following exceptions: there is an additional Data Comparison Register 405 and associated comparison logic 430 for the purpose of performing the data verification operation. In one embodiment of this invention, the circuitry that stores sensed data and for provides the data to be programmed is designed in such a way that the memory element for both operations is physically the same.

Such a data register circuit suitable for use with this invention is detailed in the aforementioned U.S. Pat. No. 5,890,152.

Figure 6:
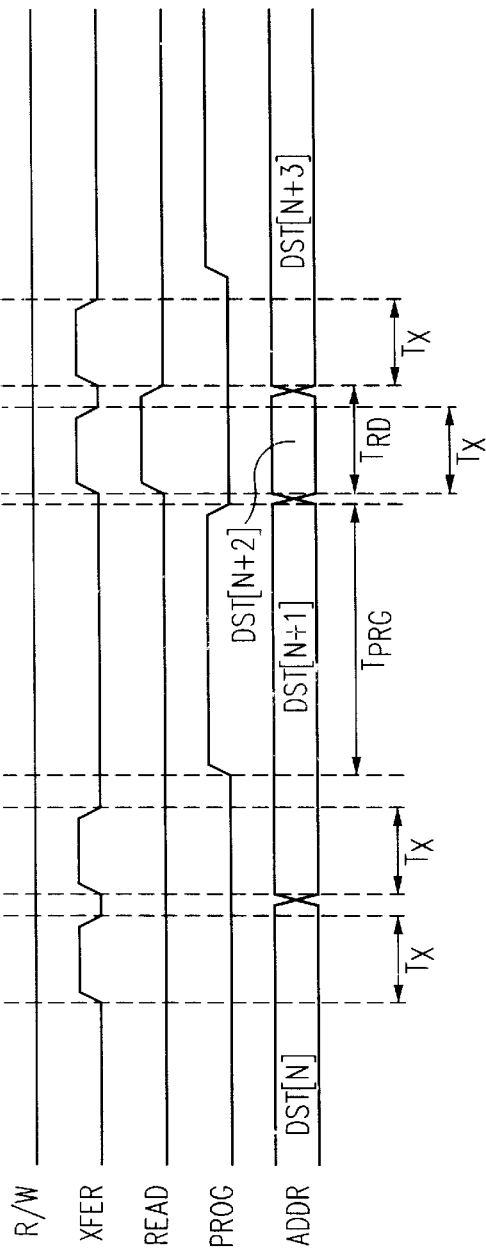
FIG. 6 illustrates a timing diagram for a two-sector program/verify operation in an embodiment of the present invention.

FIG. 6 shows a timing diagram of a two-sector program/verify operation in which data is programmed into two destination addresses (DST[n] and DST[n+1] and subsequently read in order to verify. Simultaneous with the read is the data transfers for the next pair of sectors to be written to addresses DST[N=2] and DST[n+3]. The READ signal indicates that the two sectors are being read in parallel from the addresses just programmed. The XFER signal indicates a data transfer between the flash data register and the controller. The R/W signal indicates the direction of the transfer (high is transfer to the controller, low is to the flash). Note that the R/W signal is constantly low since no data transfer takes place from the flash memory to the controller. The PROG signal indicates that the program operation is taking place upon the destination pages.

Figure 7:
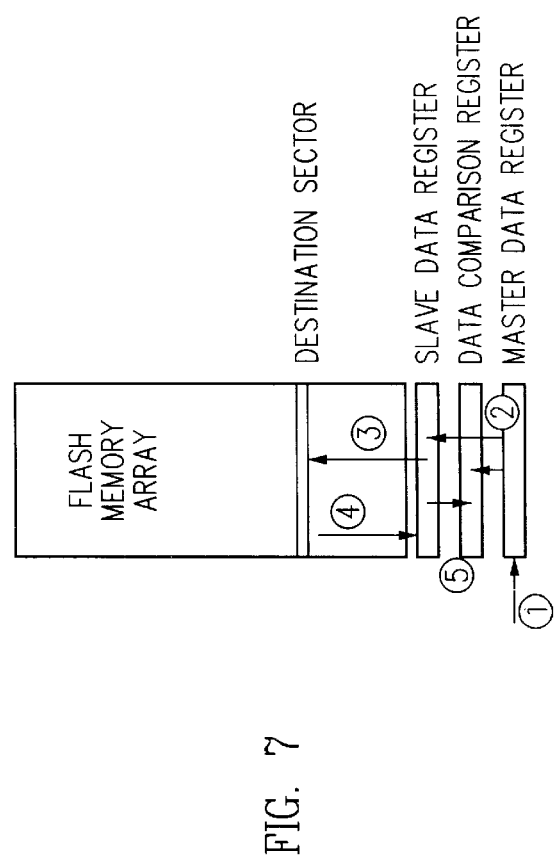
FIG. 7 illustrates the sequence of events that occur during a program/verify operation in an embodiment of the present invention.

FIG. 7 illustrates the sequence of events that occur during a program/verify operation according to this invention:

1. Transfer data from external controller circuit (not shown) to master data register 403.

2. Transfer contents of master data register 403 to slave data register 404 and data comparison register 405, for example simultaneously.
3. Program the data from slave data register 404 into flash memory array 400.
4. Read data back from flash memory array 400 into slave data register 404. Simultaneously, begin data transfers from the external bus for the next program operation (step 1) into the master data register 403.
5. Compare (430) data in slave register 404 to that in data compare register 405. The result of this comparison is saved in status register 431 which can, for example, be read by an external controller.
6. If the comparison fails, the external controller can apply the appropriate error recovery measures.

In an alternate embodiment, data transfers from the external bus to master data register 403 take place simultaneously with one or more of the steps of programming, reading data back, and comparing.

The exact cost of these verification operations varies depending on the times of the various flash memory operations, the data set size, the I/O bus width and the I/O bus cycle time. But an example of the operation of this invention using some typical values is shown below:

$$T_{RD}=25 \text{ us } T_X=26.4 \text{ us } T_{PRG}=300 \text{ us}$$

Figure 4:
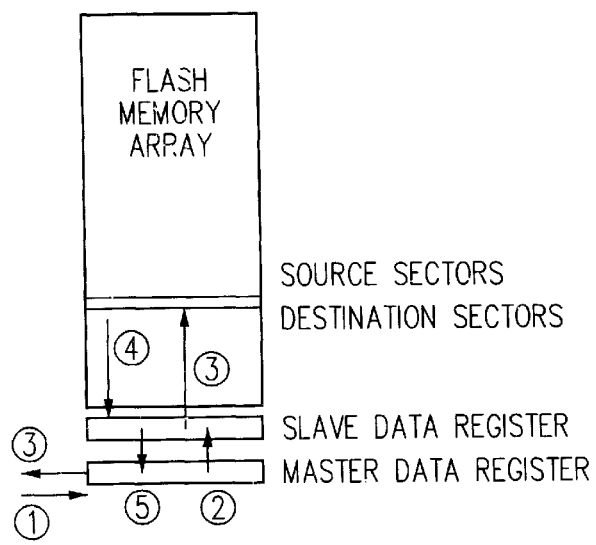
FIG. 4 illustrates the sequence of events that occur during a program/verify operation in a prior art system.

The total time to program and verify a single sector (as shown in FIG. 4).

$$T_{Pgm/Vfy}=[T_X+T_{PRG}+T_{RD}]=351.4 \text{ us}$$

This represents a 7% improvement in the program time from the single sector prior art example.

It is a general trend in non-volatile memory design to increase the number of cells that can be programmed and read at one time in order to improve the write and read performance of these devices. This can be accomplished by increasing the number of memory cell arrays on a single die, increasing the page size within a single plane, programming multiple chips in parallel or some combination of these three techniques. The result of any of these is that the data transfer length increases for the larger number of cells being programmed or read with the program and read times changing little or not at all. Thus, the expense of data verification in a system that has such increased parallelism is that much higher. Using the four-sector example from before, $$T_{Pgm/Vfy}=4*T_X+T_{PRG}+T_{RD}=426 \text{ us}$$

This represents a 20% improvement in the program time from the four sector prior art example.

It is to be understood that even though numerous characteristics and advantages of certain embodiments of the present invention have been set forth in the foregoing description, together with details of the structure and function of various embodiments of the invention, this disclosure is illustrative only, and changes may be made in detail, especially in matters of structure and arrangement of parts within the principles of the present invention to the full extent indicated by the broad general meaning of the terms in which th appended claims are expressed. For example, although the preferred embodiment described herein is directed to memories using semiconductor-based solid-state microelectronics, it will be appreciated by those skilled in the art that the teachings of the present invention can be adapted to other memories using molecular-scale organic or chemical switches. Thus, the scope of the appended claims should not be limited to the preferred embodiments described herein.

What is claimed is:

1. A non-volatile memory device comprising:
   an array of non-volatile memory cells;
   a master data register for receiving data to be stored in said array;
   a data compare register for receiving data from said master data register;
   a slave data register for receiving data from said array; and
   a comparison circuit for comparing data stored in said slave data register and said data compare register, for verifying correct programming of data in said array.

2. A device as in claim 1, wherein said memory cells comprise flash memory cells.

3. A device as in claim 1, wherein said master data register receives and/or holds a subsequent set of data for programming in said array while said comparison is taking place.

4. A system comprising:
   a memory device as in claim 1; and
   a controller that causes data to be rewritten to said array as a result of said comparison indicating an error.

5. A method for operating a non-volatile memory device comprising the steps of:
   receiving data to be stored in an array of non-volatile memory cells;
   storing said first data in a master data register;
   storing said first data in a data compare register;
   programming said first data into said array;
   reading said first data as stored in said array;
   storing said read first data into a slave data register; and
   comparing the data stored in said slave data register and said data compare register, for verifying correct programming of data in said array.

6. A method as in claim 5 wherein data is transferred from said master data register to said slave data register prior to said step of programming.

7. A method as in claim 5 wherein said master data register receives and/or holds a second set of data for programming in said array simultaneous with one or more of said steps of programming, reading, and comparing.

8. A method as in claim 5 which further includes, as a result of said step of comparing indicating the incorrect programming of data in said array, the additional step of reprogramming said data to said array.

9. A method as in claim 8 which further comprises the step of, subsequent to said step of reprogramming, repeating said steps of reading and comparing.

* * * * *